Sept. 15, 1970 D. R. RODAL 3,529,206

RAPID RETRACE YOKE DRIVER

Filed March 1, 1968

INVENTOR.
DAVID R. RODAL

BY

Robert G. Clay

ATTORNEY

United States Patent Office 3,529,206

Patented Sept. 15, 1970

3,529,206

RAPID RETRACE YOKE DRIVER

David R. Rodal, Palo Alto, Calif., assignor to Ampex Corporation, Redwood City, Calif., a corporation of California Filed Mar. 1, 1968, Ser. No. 709,681

Int. Cl. H01j 29/76

U.S. Cl. 315—27 3 Claims

ABSTRACT OF THE DISCLOSURE

Apparatus for improving the time response and linearity of a deflection yoke driver circuit for electron beams, including a feedforward amplifier loop used in conjunction with a conventional feedback amplifier circuit, wherein the feedforward loop is coupled across the conventional amplifier circuit to overcome the bandwidth limitations of the amplifier circuit and the deflection yoke. The apparatus includes an inductor coupled to and thus forming a part of, the output stage of the amplifier circuit for storing the energy required to rapidly switch the current introduced to the deflection yoke through a relatively large current change.

The invention herein described was made in the course of a contract with the Department of the Army.

BACKGROUND OF THE INVENTION

Field of the invention

The present invention relates to magnetic deflection circuits for driving electron beams and more particularly to an improved yoke driver as employed in sweep circuits for electron beam recorders.

Description of the prior art

Various prior art circuits are available for driving deflection yokes of electron beam devices, wherein typical circuits have a feedforward circuit which introduces a correcting signal to the output circuit of the deflection amplifier which drives the deflection yoke. The value of the signal introduced by the feedforward circuit is commensurate with the value of the signal required by the yoke for proper deflection characteristics. Such prior art systems have a time-response linearity and a general efficiency which is sufficient for the usual commercial application.

However, in various sophisticated electron beam systems such as, for example, in high density electron beam recorders, extremely short retrace times and improved linearity during the trace times, are required in order to prevent any loss of information during the recording process. In such systems, prior art circuits fail to provide the required efficiency due to high power dissipation effects in the active elements thereof, poor retrace time, and nonlinearity due to overload.

Generally, prior art amplifier circuits used to drive the deflection yokes are improved by increasing the gain of the amplifiers, which however, in turn gives rise to problems of stability. Furthermore, in systems which require rapid retrace times, the deflection yoke requires on the order of from 60 to 120 volts to accomplish retrace at the desired speeds. Such voltage is somewhat incompatible with present day high speed semiconductors, which are used in the amplifier deflection circuits. The bandwidth or speed of high power transistors is greatly limited, therefore dictating a circuit design which delivers the required relatively high voltage and current with little power loss. The requirement is aggravated by the fact that most deflection output circuits have to deliver the full load current at the full voltage across the output transistor. This gives rise to a relatively high peak power during the first part of the trace time. This relatively high power dissipation level precludes the use of most high speed semiconductor devices and therefore makes an extremely fast retrace of, for example, 0.6 microsecond, difficult if not impossible.

SUMMARY OF THE INVENTION

The present invention provides an improved yoke driver circuit utilizing inductor means to store energy and thus reduce power dissipation of the driver circuit output transistor which drives the deflection yoke, and further provides feedforward compensation which, in conjunction with a conventional feedback circuit, improves the response and linearity of the circuit. To this end, an energy storage inductor is coupled to the output circuit and provides the high degree of voltage change necessary to rapidly switch the yoke flux. Thus the output transistor may deliver current at a relatively low voltage thereby greatly reducing the power dissipation.

In addition, compensation is added to the driver circuit, to provide a better response during the retrace time and improved linearity during the trace time, in the form of a compensation circuit which derives a signal from the input signal and introduces it to the input of the driver output circuit. The compensation circuit utilizes a feedforward amplifier circuit which is coupled from the input signal into the input of the output stage of the conventional deflection amplifier circuit, wherein the feedforward circuit is designed to apply the approximate required waveform to the input of the output stage and the conventional feedback circuit then need only supply the feedback signal required to provide the desired output waveform.

It is to be understood that the invention concepts are not limited to use with yoke driver circuits alone, but may be employed in any circuit where a known, repetitive input waveform is used.

DESCRIPTION OF THE PREFERRED EMBODIMENT

Figure 1:
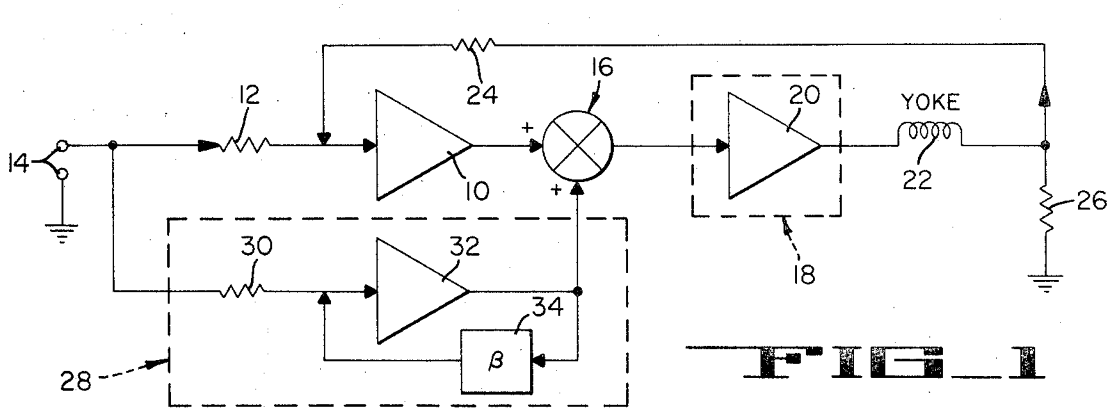
FIG. 1 is a simplified block diagram of a rapid retrace yoke driver in accordance with the invention.

Referring accordingly to FIG. 1, amplifiers 10 and 20 define in essence a basic amplifier such as conventionally used to drive deflection yokes. However, for purposes of description, amplifier 20 is shown separately and is defined herein as the output amplifier stage or circuit. Amplifier 10 is coupled at its input to an input signal via a resistor 12 and input terminals 14. The amplifier 10 (hereinafter termed the basic amplifier) is coupled at its output to a summing junction 16, which in turn is coupled to an output circuit generally indicated by numeral 18 and comprising essentially the output amplifier 20 of previous mention, modified in accordance with the invention as described hereinafter. The output circuit 18 is connected to a deflection yoke 22 of an electron beam device, the other end of which is coupled via a resistor 24 back to the input of the basic amplifier 10 to define a conventional feedback loop. The same end of yoke 22 is coupled to ground via a resistor 26. Resistors 12, 24 and 26 determine the closed loop gain of the feedback loop.

In accordance with the invention, a compensation circuit 28 is coupled between the input terminals 14 and the summing junction 16. The compensation circuit 28 comprises essentially a resistor 30 inserted between the input terminal 14 which is not grounded, and a compensating amplifier 32, which in turn is coupled to the summing junction 16. A $\beta$ circuit 34 is coupled across the compensating amplifier 32 and is a passive network designed to determine the closed loop response of the compensation circuit 28.

The compensation circuit 28 is designed to apply the approximate required waveform to the input of the output amplifier, e.g., the output circuit 18. Accordingly the compensation circuit 28 and the output amplifier 20 form a good open loop driver circuit. The amplifier 10 and closed loop feedback path are then utilized to correct only the errors of the open loop path and not provide the total drive signal. This type of compenstion utilizing both a feedforward and a feedback loss in accordance with the invention, permits the use of lower loop gains and bandwidths for the same output performance.

Thus it may be seen that the compensating amplifier 32 provides the signal normally required by the output amplifier 20. That is, amplifiers 20 and 32 are designed to provide the best possible signal to the load, e.g., the yoke 22. Amplifier 10 is then added to reduce the errors between the output and the input. Without compensating amplifier 32 the basic amplifier 10 would have to provide the signal of amplifier 32 as well as the error signals. Therefore, in accordance with the invention the insertion of compensating circuit 28 has reduced the demand on the basic amplifier 10 and has improved thereby the output response and linearity of the yoke driver circuit.

Figure 2:
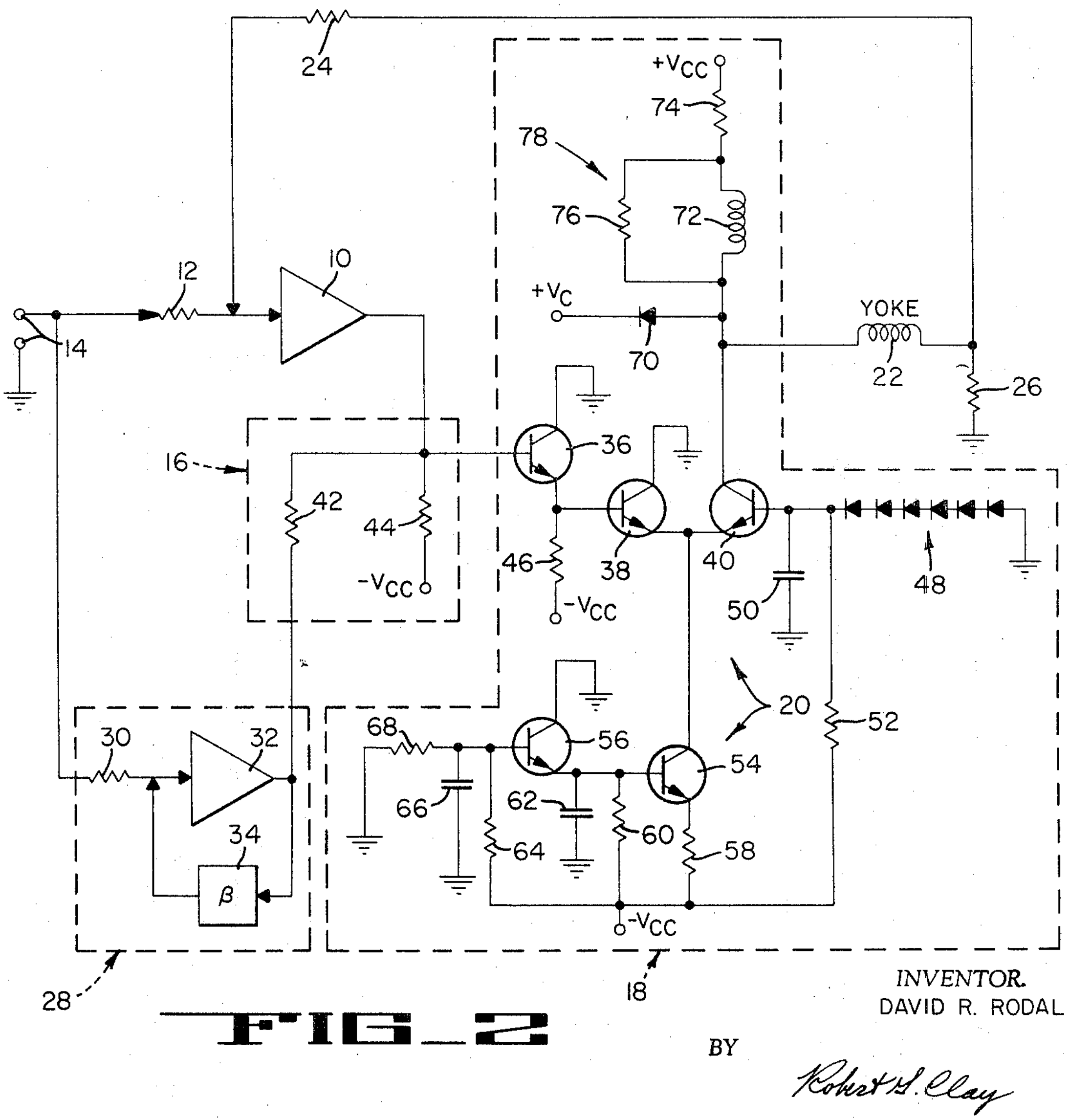
FIG. 2 is a schematic diagram showing in greater detail the circuit of FIG. 1.

Referring particularly to FIG. 2, the output circuit 18 is shown in greater detail as modified in accordance with the invention concept. The output amplifier 20 comprises essentially a conventional output stage of a basic deflection amplifier, but is herein shown separated therefrom to define the output circuit 18, which includes the transistors 36, 38 and output transistor 40.

More particularly, the compensation circuit 28 is connected at its output to the summing junction 16 formed in part of a resistor 42, which in turn is coupled to the base of the transistor 36. The summing junction 16 further includes a resistor 44 connected at one end to the common junction between the amplifier 10, resistor 42, and the base of transistor 36. The other end of resistor 44 is coupled to a selected negative voltage, $-V_{cc}$, which in the present example, is of the order of −12 volts, The collector of transistor 36 is connected to ground, and the emitter thereof is connected to the voltage $-V_{cc}$ via a resistor 46. The emitter of transistor 36 is also coupled to the base of transistor 38, whose collector is connected to ground, and whose emitter is connected to the emitter of the output transistor 40. The base of the transistor 40 is coupled to the cathode side of a series of diodes 48 whose anode side is coupled to ground. The base of transistor 40 is coupled to ground via a capacitor 50. The common junction between the capacitor 50 and diodes 48 is connected to the voltage $-V_{cc}$ via a resistor 52.

The emitters of the transistors 38, 40 are coupled to a non-inductive bias formed of transistors 54, and 56, where the collector of transistor 54 is coupled to the emitters of transistors 38, 40. The emitter of transistor 54 is coupled to the voltage $-V_{cc}$ via a resistor 58, and the base thereof is coupled to $-V_{cc}$ via a resistor 60. The base of transistor 54 is also connected to the emitter of transistor 56, and from thence to ground via a capacitor 62. The collector of transistor 56 is coupled to ground and the base thereof is coupled to the voltage $-V_{cc}$ via a resistor 64, and is further connected to ground via a capacitor 66 as well as a resistor 68.

Thus it may be seen that the output transistor 40 is connected in a common-base mode by virtue of the low impedance of the capacitor 50 and the direct current bias network of resistor 52 and the diodes 48. The diodes 48 provide low impedance negative bias for the transistor 40.

In accordance with the invention the collector of output transistor 40 is connected to one end of the deflection yoke 22, and also to the anode of a diode 70 whose cathode is connected to a selected positive voltage, $+V_c$ wherein $+V_c$ may be of the order of +70 volts. An inductor 72 is connected at one end to the common junction of the diode 70, the collector of transistor 40 and the yoke 22, and the other end thereof is connected to a selected positive voltage $+V_{cc}$ via a resistor 74, wherein $+V_{cc}$ may be of the order of +12 volts. A resistor 76 is connected across the inductor 72. The components 70–76 define in essence an inductor means for storing the high energy required to effect the relatively short retrace time, and which is generally indicated by numeral 78.

Thus the inductor means 78 (viz, inductor 72) is used to store the energy necessary to switch the deflection yoke 22 at which time transistor 40 in conjunction with resistor 74 controls the yoke current. That is, resistor 74 is a current limiting resistor for the inductor 72. The diode 70 is used to clamp the output voltage and prevent breakdown of the output transistor 40. Resistor 76 damps the ringing generated in the inductor 72 and the yoke 22 during retrace.

Accordingly, it may be seen that application of the inductor means 78 reduces the power dissipation in the output transistor 40 by eliminating the need to deliver a high current at a high voltage during the early part of the trace time.

Although the invention has been described herein with respect to various embodiments, it is to be understood that various modifications could be made thereto within the spirit of the invention.

For example, other types of solid state devices, such as silicon controlled rectifiers, may be utilized in place of transistors, particularly in the output stage, whereupon a capacitive component is used as the means for storing energy. Furthermore it is to be understood that the invention is not limited to use with yoke driver circuits, but may be employed in any circuit where a known, repetitive input waveform is used. Thus it is not intended to limit the invention except as defined in the following claims.

I claim:

1. A rapid retrace yoke driver for driving a deflection yoke and including a deflection amplifier with an output circuit, the driver having improved time response and linearity as well as improved power dissipation characteristics, the combination comprising: reactance means coupled to said output circuit for providing selected energy to the deflection yoke during the retrace portion of the yoke deflection cycle; said reactance means further including, an inductor coupled at one end to the deflection yoke and at the other end to a selected voltage source, and means coupled to the junction of the inductor and the deflection yoke for clamping the output voltage at a selected level; and compensation circuit means operatively coupled to and forming a part of the deflection amplifier to provide a signal output of selected waveform to the deflection yoke.

2. The driver of claim 1 wherein the compensation circuit includes feedforward loop means coupled from the input of the deflection amplifier to the input of the output circuit, said feedforward loop means including a compensating amplifier for providing the approximate required waveform for driving the deflection yoke to the input of said output circuit.

3. The driver of claim 2 including a feedback loop coupled from the deflection yoke to the input of the deflection amplifier, wherein the feedforward loop means includes a $\beta$ circuit coupled across the compensating amplifier, wherein the $\beta$ circuit determines the closed loop response of the compensation circuit, and the feedback loop is adapted to provide a signal representative of any error between the output of the feedforward loop and the desired output waveform.

References Cited

UNITED STATES PATENTS

| | | |
|---|---|---|
| 3,041,470 | 6/1962 | Woodworth. |
| 3,111,602 | 11/1963 | Hellstrom. |

RODNEY D. BENNETT, Jr., Primary Examiner

J. G. BAXTER, Assistant Examiner